United States Patent
Chen et al.

(10) Patent No.: US 10,901,054 B1
(45) Date of Patent: Jan. 26, 2021

(54) INTEGRATED OPTICAL WAVEGUIDE AND ELECTRONIC ADDRESSING OF QUANTUM DEFECT CENTERS

(71) Applicant: HRL LABORATORIES, LLC, Malibu, CA (US)

(72) Inventors: Edward H. Chen, Woodland Hills, CA (US); Matthew J. Pelliccione, Santa Monica, CA (US); David T. Chang, Calabasas, CA (US); Raviv Perahia, Agoura Hills, CA (US); Biqin Huang, Torrance, CA (US)

(73) Assignee: HRL Laboratories, LLC, Malibu, CA (US)

( * ) Notice: Subject to any disclaimer, the term of this patent is extended or adjusted under 35 U.S.C. 154(b) by 80 days.

(21) Appl. No.: 16/399,649

(22) Filed: Apr. 30, 2019

Related U.S. Application Data

(60) Provisional application No. 62/676,443, filed on May 25, 2018, provisional application No. 62/768,534, filed on Nov. 16, 2018.

(51) Int. Cl.
    *G01R 33/345*      (2006.01)
    *G01R 33/36*      (2006.01)
    *G01R 33/26*      (2006.01)

(52) U.S. Cl.
    CPC ......... *G01R 33/345* (2013.01); *G01R 33/26* (2013.01); *G01R 33/3607* (2013.01)

(58) Field of Classification Search
    CPC .. G01R 33/345; G01R 33/3607; G01R 33/26; G01R 33/0017; G01R 33/0206;
(Continued)

(56) References Cited

U.S. PATENT DOCUMENTS 9,778,329 B2 * 10/2017 Heidmann ............. G11B 5/455
10,036,797 B2 * 7/2018 Suzuki ................ G01R 33/323
(Continued)

FOREIGN PATENT DOCUMENTS

| WO | WO-2015161136 A1 * | 10/2015 | ......... G01N 21/9501 |
| WO | WO-2017217847 A1 * | 12/2017 | ............. G01R 33/26 |
| WO | WO-2018125226 A1 * | 7/2018 | ............... G02B 6/00 |

OTHER PUBLICATIONS

Barry et al., "Optical magnetic detection of single-neuron action potentials using quantum defects in diamond," PNAS, 113(49): 14133-14138, Dec. 6, 2016.
(Continued)

*Primary Examiner* — Thomas A Hollweg
*Assistant Examiner* — Mary A El-Shammaa
(74) *Attorney, Agent, or Firm* — Lewis Roca Rothgerber Christie, LLP

(57) ABSTRACT

An atomic defect sensor for measuring a magnitude of a physical parameter comprises an optical waveguide comprising an atomic defect site located within the optical waveguide, the optical waveguide being configured to guide an optical signal toward the atomic defect site, a first doped fin integrated with the optical waveguide at a first side of the optical waveguide, and a second doped fin integrated with the optical waveguide at a second side of the optical waveguide, wherein the atomic defect site is configured to be energetically stimulated by the optical signal in the presence of an RF signal, and to generate a photocurrent corresponding to the magnitude of the physical parameter and a voltage differential between the first and second doped fins.

20 Claims, 11 Drawing Sheets

(58) Field of Classification Search
CPC .............. G01R 33/0035; G01R 33/022; G01R 33/091; G01R 33/1284; G01R 31/2656; G01R 31/2601; G01R 31/308; G01R 23/17

See application file for complete search history.

(56) References Cited

U.S. PATENT DOCUMENTS

| | | | |
|---|---|---|---|
| 10,677,953 B2 * | 6/2020 | Stetson | G01V 3/101 |
| 2015/0277158 A1 * | 10/2015 | Akiyama | G02F 1/025 385/3 |
| 2017/0067830 A1 * | 3/2017 | Adell | G01N 21/636 |
| 2017/0281102 A1 * | 10/2017 | Ken | G01B 9/02 |
| 2017/0328965 A1 | 11/2017 | Hruby et al. | |
| 2018/0136291 A1 * | 5/2018 | Pham | G01N 24/12 |
| 2018/0183212 A1 * | 6/2018 | Van Campenhout | H01S 5/0218 |
| 2018/0301569 A1 * | 10/2018 | Jacob | H01L 31/1804 |

OTHER PUBLICATIONS

Bourgeois et al., "Enhanced photoelectric detection of NV magnetic resonances in diamond under dual-beam excitation," American Physical Society, 5 pages, 2017.

Bourgeois et al., "Photoelectric detection of electron spin resonance of nitrogen-vacancy centres in diamond," Nature Communications, 8 pages, 2015.

Chen et al., "Optical quenching and recovery of photoconductivity in single-crystal diamond," Applied Physics Letters, 9 pages, 2017.

Fescenko et al., "Diamond magnetic microscopy of malarial hemozoin nanocrystals," arXiv preprint arXiv:1808.03636, 17 pages, 2018.

Glenn et al., "Micrometer-scale Magnetic Imaging of Geological Samples Using a Quantum Diamond Microscope," Geochemistry, Geophysics, Geosystems, 41 pages, 2017.

Hall et al., "High spatial and temporal resolution wide-field imaging of neuron activity using quantum NV-diamond," Scientific Reports, 9 pages, 2012.

Horsley et al., "Microwave device characterization using a widefield diamond microscope," arXiv preprint arXiv:1802.07402, 10 pages, 2018.

Hrubesch et al., "Efficient electrical spin readout of NV centers in diamond," Physical review letters 118.3, 6 pages, 2017.

Loncar et al., "Quantum photonic networks in diamond," MRS Bulletin, vol. 38, 5 pages, Feb. 2013.

Mehta et al., "Precise and diffraction-limited waveguide-to-free-space focusing gratings," Scientific Reports, Nature, 8 pages, 2017.

Mizuno et al., "Wide-field diamond magnetometry with millihertz frequency resolution and nanotesla sensitivity," arXiv preprint arXiv:1807.04444, 5 pages, 2018.

Schloss et al., "Simultaneous Broadband Vector Magnetometry Using Solid-State Spins," arXiv preprint arXiv:1803.03718, 13 pages, 2018.

* cited by examiner

INTEGRATED OPTICAL WAVEGUIDE AND ELECTRONIC ADDRESSING OF QUANTUM DEFECT CENTERS

CROSS-REFERENCE TO RELATED APPLICATION(S)

This application claims priority to, and the benefit of, U.S. Provisional Application No. 62/676,443 ("HIGH-DENSITY MAGNETIC FIELD IMAGING ARRAY"), filed on May 25, 2018, and U.S. Provisional Application No. 62/768,534 ("HIGH-DENSITY MAGNETIC FIELD IMAGING ARRAY"), filed on Nov. 16, 2018, the entire contents of which are incorporated herein by reference.

This application is related to U.S. patent application Ser. No. 16/399,651 entitled "ON-CHIP EXCITATION AND READOUT ARCHITECTURE FOR HIGH-DENSITY MAGNETIC SENSING ARRAYS BASED ON QUANTUM DEFECTS," filed on Apr. 30, 2019, the entire content of which is incorporated herein by reference.

FIELD

Aspects of the present invention relate to the field of defect-based sensors.

BACKGROUND

Recent advances in the field of nanotechnology have led to great interest in developing sensing techniques that work at the nanoscale. Research has shown that spin defects in large band gap materials, including diamond and silicon carbide, are capable of operating as sensors for electromagnetic fields, mechanical forces, material strain, and high energy particles with nanometer-scale spatial resolution.

The readout mechanism for such defect-based sensors has been predominantly based on optical detection of fluorescence. However, the inefficiencies associated with optical readout, including internal reflection losses, significantly limit the signal-to-noise ratios achievable with this sensing technology. Also, conventional defect-based sensors often require large table-top optical equipment that have to be properly aligned.

The above information disclosed in this Background section is only for enhancement of understanding of the invention, and therefore it may contain information that does not form the prior art that is already known to a person of ordinary skill in the art.

SUMMARY

Aspects of embodiments of the present invention are directed toward an atomic defect sensor utilizing atomic defects to enable high spatial resolution (sub-micron), high sensitivity, and portable sensors for measuring magnetic, electric, strain, or temperature fields. In some embodiments, the atomic defects are used as atomic magnetometers capable of measuring and spatially mapping the strength of a magnetic field with high precision and at high spatial resolution.

According to some embodiments of the present invention, there is provided an atomic defect sensor for measuring a magnitude of a physical parameter, the atomic defect sensor including: an optical waveguide including an atomic defect site located within the optical waveguide, the optical waveguide being configured to guide an optical signal toward the atomic defect site, a first doped fin integrated with the optical waveguide at a first side of the optical waveguide; and a second doped fin integrated with the optical waveguide at a second side of the optical waveguide, wherein the atomic defect site is configured to be energetically stimulated by the optical signal in the presence of an RF signal, and to generate a photocurrent corresponding to the magnitude of the physical parameter and a voltage differential between the first and second doped fins.

In some embodiments, a change in the photocurrent from a first level to a second level, at a first frequency and a second frequency of the RF signal, indicates resonance, and the magnitude of the physical parameter corresponds to a frequency separation between first and second frequencies of the RF signal.

In some embodiments, a difference between the first and second levels is about 1% to about 20% of the first level.

In some embodiments, the first and second doped fins are configured to receive a first voltage and a second voltage, respectively, and the voltage differential between the first and second doped fins is a difference between the first and second voltages.

In some embodiments, the voltage differential is about 1 volt to about 10 volts, and the photocurrent is about 1 pA to about 10 nA.

In some embodiments, one of the first and second doped fins is configured to capture the generated photocurrent.

In some embodiments, the physical parameter is a strength of a magnetic field at a location of the atomic defect site.

In some embodiments, the atomic defect sensor further includes: a first electrode contacting the first doped fin at a bottom side of the atomic defect sensor; and a second electrode contacting the second doped fin at the bottom side of the atomic defect sensor, wherein the atomic defect site is closer to a top side of the atomic defect sensor than the bottom side.

In some embodiments, the first and second doped fins are at positions along the first and second sides, respectively, that correspond to a location of the atomic defect site.

In some embodiments, the atomic defect site and the first and second doped fins are aligned along a same axis.

In some embodiments, the optical waveguide includes diamond or silicon-carbide (SiC).

In some embodiments, the atomic defect site includes one or more nitrogen vacancy (NV) centers.

In some embodiments, the first and second doped fins include a same intrinsic material as the optical waveguide.

In some embodiments, the first doped fin further includes p-type doping and the second doped fin further includes n-type doping.

In some embodiments, the p-type doping includes boron and the n-type doping includes phosphorous.

In some embodiments, both of the first and second doped fins further include p-type dopings.

In some embodiments, the optical signal has a wavelength of about 532 nm.

In some embodiments, the atomic defect sensor further includes: a plurality of atomic defect sites including the atomic defect site, the plurality of atomic defect sites being periodically distributed throughout a length of the optical waveguide.

In some embodiments, the atomic defect sensor further includes: a plurality of first doped fins including the first doped fin and integrated with the optical waveguide at the first side of the optical waveguide; and a plurality of second doped fins including the second doped fin and integrated with the optical waveguide at the second side of the optical waveguide wherein the plurality of first and second fins are positioned to correspond to locations of corresponding plurality of atomic defect sites.

In some embodiments, a distance between adjacent ones of the plurality of atomic defect sites is about 1 µm.

BRIEF DESCRIPTION OF THE DRAWINGS

The accompanying drawings, together with the specification, illustrate example embodiments of the present invention, and, together with the description, serve to explain the principles of the present invention.

DETAILED DESCRIPTION

Figure 1A:
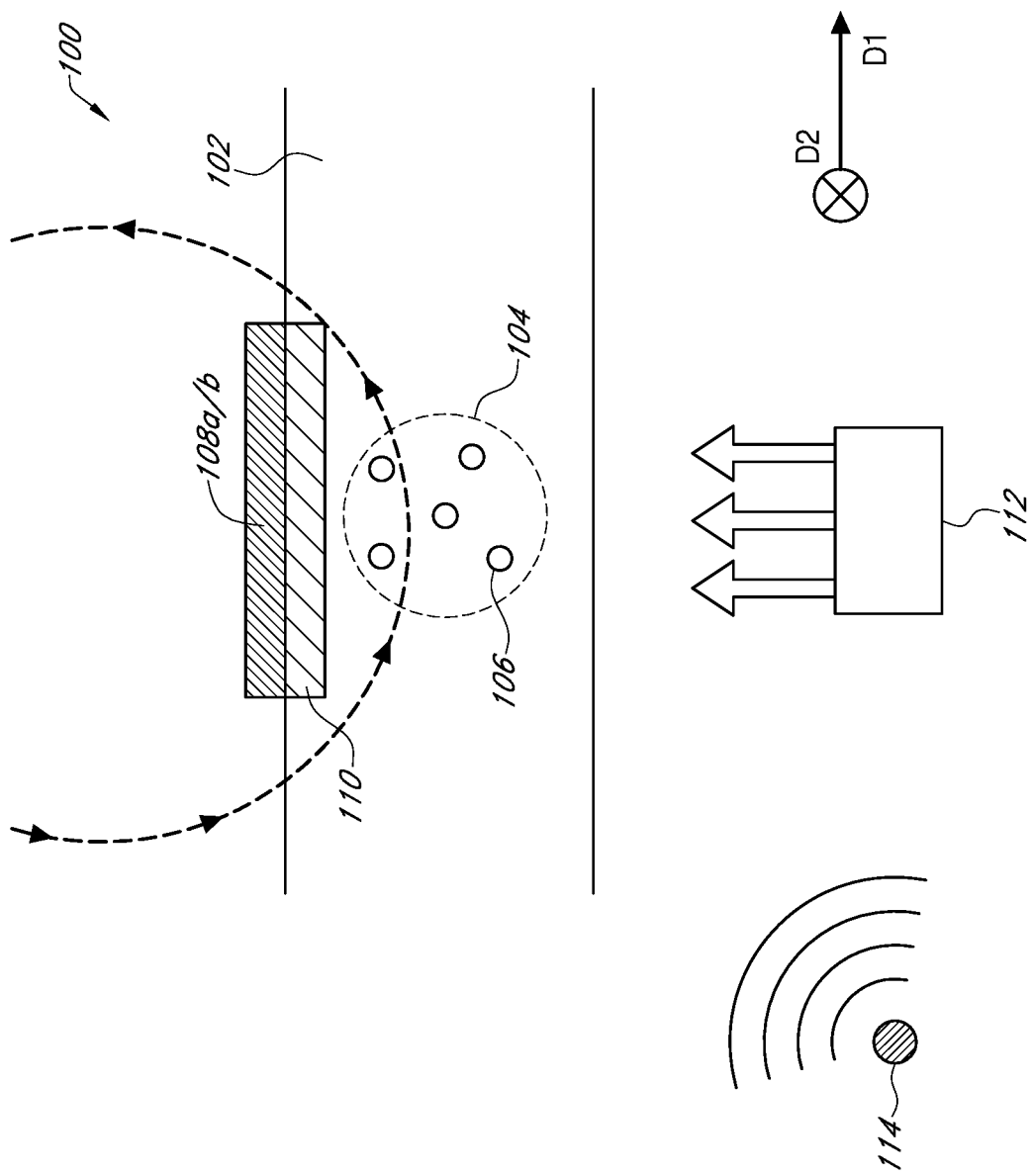
FIG. 1A is a cross-sectional view of an atomic defect sensor, according to some embodiments of the present invention.

In the following detailed description, only certain example embodiments of the present invention are shown and described, by way of illustration. As those skilled in the art would recognize, the invention may be embodied in many different forms and should not be construed as being limited to the embodiments set forth herein. Descriptions of features or aspects within each example embodiment should typically be considered as being available for other similar features or aspects in other example embodiments. Like reference numerals designate like elements throughout the specification.

Embodiments of the present invention utilize atomic defects as sensors (or transducers) as they exhibit high sensitivity to external factors, such as magnetic fields, temperatures, stress, etc. The atomic scale of such sensors enables embodiments of the present invention to be deployed in applications that benefit from very high spatial resolution (sub-micron), high sensitivity, and portable needs for measuring magnetic, electric, strain, or temperature fields.

Accordingly, some embodiments of the present invention are directed to an architecture for the deployment of atomic defect-based sensors (referred to herein as atomic defect sensors) in large-scale, high-density arrays. In some embodiments, the atomic defects are used as atomic magnetometers capable of measuring and spatially mapping the strength of a magnetic field with high precision and at high spatial resolution.

One example use case may be monitoring an integrated circuit (IC) as it is running to detect abnormal behavior. In some embodiments, an array of atomic sensors acts as a real-time magnetic camera, which, for example, allows the detection of currents passing through a circuit in real-time (i.e., by mapping the magnetic fields generated by the currents). For example, in a wafer with thousands of chips, an atomic sensor array according to some embodiments of the present invention may be able to identify those chips that are not behaving like the other chips, and flag the identified chips as potentially defective.

Other example use cases may be precisely aligning (e.g., at micron scale) machining tools on opposite sides of very large parts, such as an airplane wing during assembly. Further, brain imaging using magnetoencephalography (MEG) may leverage the sensing array to help pinpoint locations of signals generated by brain activity.

As noted above, the use case of the present invention are quite varied, and applications range from, for example, material science to the life sciences.

According to some embodiments, on-chip optical waveguides are utilized for excitation of atomic defects (e.g., nitrogen-vacancy defects), and customized electronic doping profiles (e.g., P-I-N or P-I-P doping profiles) are used to perform electrical read out of sensed information. This allows defects to be addressed optically and read out electrically fully on-chip, thus enabling a scalable and portable architecture for deploying such sensors. High-density packaging of these components may allow for sub-micron pixel sizes in imaging applications. According to some embodiments, the unique P-I-N/P-I-P intrinsic diamond doping structure of the atomic defect sensor overcomes the ohmic losses associated with related art device technologies to achieve an improvement in signal-to-noise (SNR) ratio up to a factor of 100 times larger than annealed metal contacts.

Figure 1B:
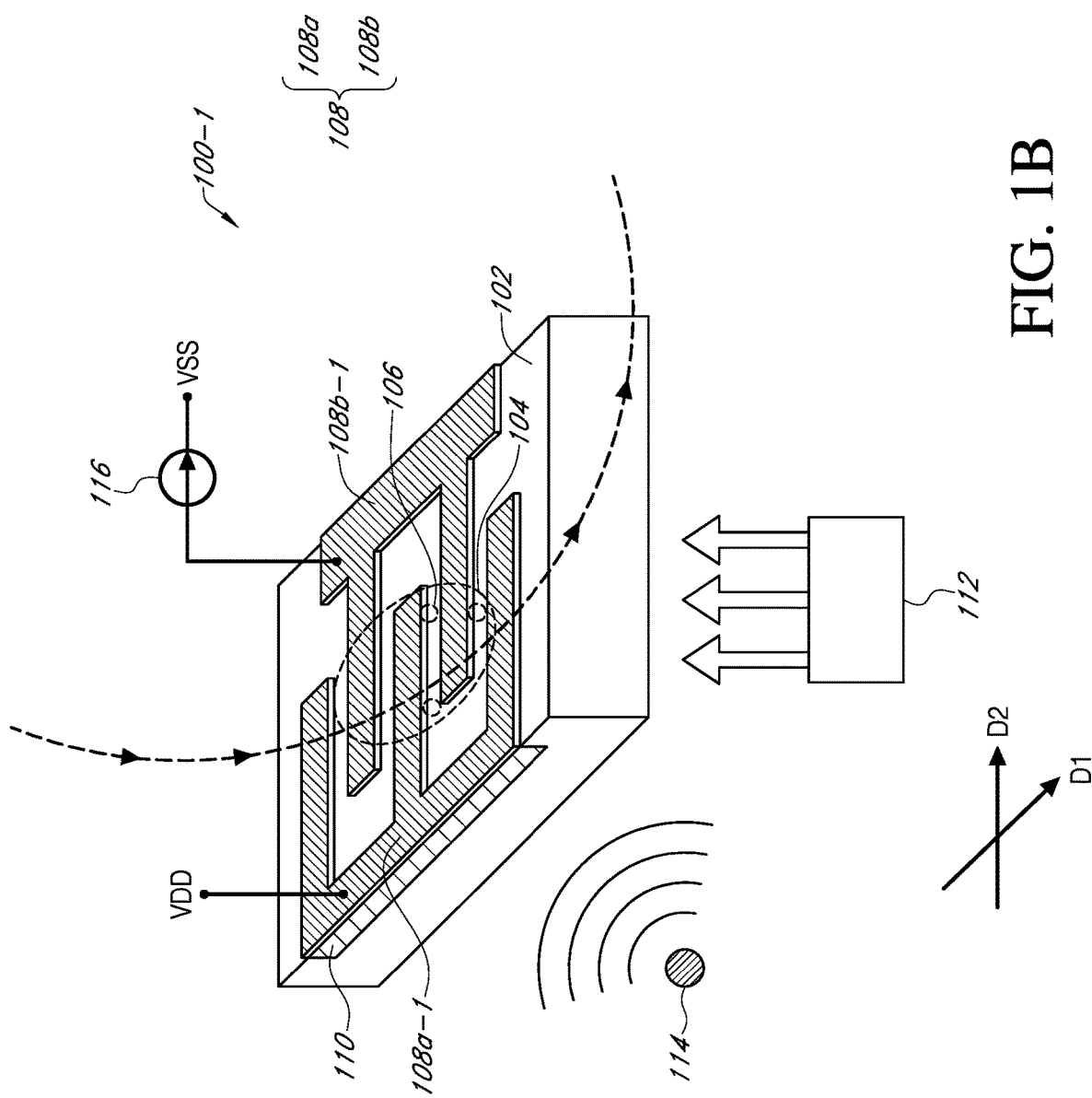
FIG. 1B is a perspective view of the atomic defect sensor, according to some embodiments of the present invention.
Figure 1C:
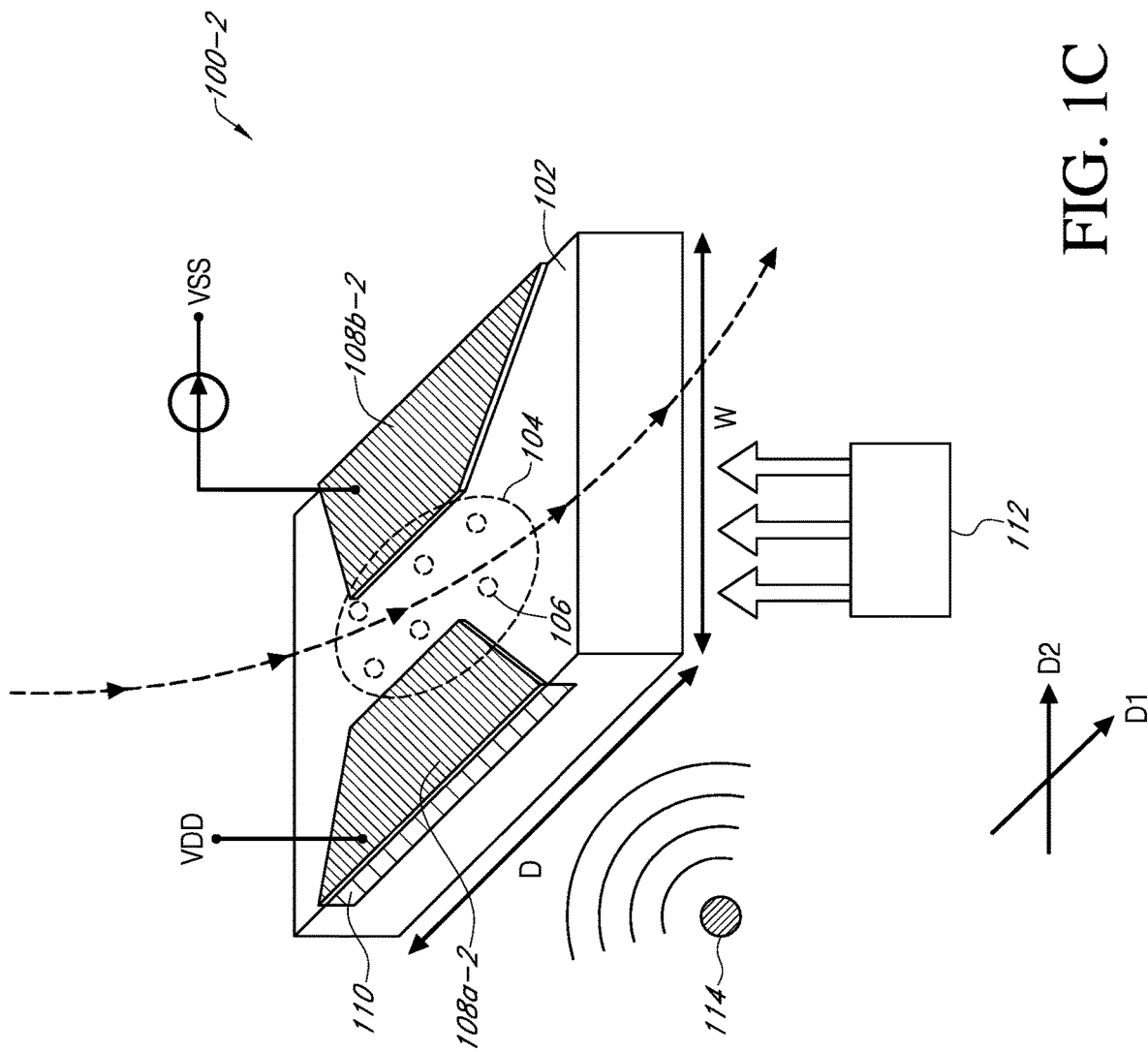
FIG. 1C is a perspective view of the atomic defect sensor, according to some embodiments of the present invention.

FIG. 1A is a cross-sectional view of an atomic defect sensor 100, according to some embodiments of the present invention. FIG. 1B is a perspective view of the atomic defect sensor 100-1, according to some embodiments of the present invention. FIG. 1C is a perspective view of the atomic defect sensor 100-2, according to some embodiments of the present invention.

Referring to FIGS. 1A-1B, according to some embodiments, the atomic defect sensor 100 includes a substrate (an electrically-insulating, optically transparent substrate) 102 including a large bandgap material, such as diamond, silicon carbide (SiC), and or the like; a defect site 104 including one or more atomic defect centers (e.g., atomic-scale quantum defects) 106 within the substrate 102; a pair of electrodes 108a and 108b on the substrate 102 and overlapping with the defect site 104; and a doped region 110 within the substrate 102 and below the pair of electrodes 108a and 108b. In embodiments in which the substrate 102 includes diamond, the atomic defect centers 106 may include nitrogen-vacancy (NV) color centers, and in embodiments in which the substrate 102 includes silicon carbide (SiC), the atomic defect centers 106 may include a missing carbon or silicon atom. Each of the NV color centers may include a single substitutional nitrogen atom associated to a nearest-neighbor vacancy.

The atomic defect centers 106 may be created using any suitable technique known to a person of ordinary skill in the art. For example, NV centers may be created by irradiating a diamond substrate with Nitrogen ions, irrigating the substrate with vacancies, and then annealing the diamond substrate to cause the vacancies to move and bind/link with the Nitrogen atoms to produce NV centers. However, embodiments of the present invention are not limited thereto.

In some embodiments, a first voltage VDD (e.g., a high voltage, e.g., 5 V) is applied to the first electrode 108a and a second voltage (e.g., a low voltage, e.g., 0 V) is applied to the second electrode 108b. The current collected by the electrode pair 108 may be measured using a current sensor (e.g., an ammeter) 116. In some embodiments, a doping region 110 is formed in the substrate 102 below the electrode pair 108, which improves the ohmic contact resistance between the electrode pair 108 and the substrate 102, and makes it easier to extract electrons from the defect sites 104 and improve readout signal-to-noise ratio (SNR). This may be particularly desired when the substrate 102 is a diamond substrate, as diamond may not form a good metal contact (i.e., may have high contact resistance). The doping region 110 may include two separate doping portions, one of which is formed beneath the first electrode 108a and the other of which is formed beneath the second electrode 108b. The two doping portions may be N-type-N-type, N-type-P-type, or P-type-P-type. For example, in embodiments having a SiC substrate, the doping region 110 may include separate N-type and P-type doping portions, and in embodiments having a diamond substrate, the doping region 110 may include separate P-type doping portions.

In embodiments that utilize a substrate of SiC, common doping techniques may be used to form the doping region 110 below the electrode pair 108. However in embodiments that utilize a diamond substrate, the diamond is grown with the doped regions.

According to some embodiments, the atomic defect site 104 is configured to be energetically stimulated by light of a first frequency (which may be within the green light spectrum in the case of NV defects) when in the presence of an RF signal, and to generate a photocurrent corresponding to the magnitude of the physical parameter (e.g., magnetic field) and a voltage differential across the pair of electrodes 108a and 108b, which are at opposite sides of the atomic defect site 104. In some examples, light of the first frequency may include light in the range of about several hundred nanometers. For example, in the case of NV centers in diamond, the light may range from about 500 nm to about 637 nm, and in the case of defect centers in SiC, the light may range from about 750 nm to about 900 nm.

In an atomic defect center 106, an electron, when stimulated to a higher energy level by light of the first frequency, can return to its ground state (e.g., ground electron spin state) of ms=0 by emission of a photon of a second frequency (e.g., a red color photon, in the case of NV centers), which can be detected in optically detected magnetic resonance (ODMR) techniques of the related art. In the presence of an electric field created by the voltage difference across the first and second electrodes 108a and 108b, the excited electron may be carried to one of the electrodes 108a and 108b, which can result in a photocurrent that may be detected by the current sensor. The light of the first frequency may be generated by the light source 112, which may be a laser light source.

In the absence of a magnetic field, applying microwave radiation/RF signal (via the microwave/RF source 114) of a particular frequency can result in transitions to a degenerate state (e.g., a degenerate electron spin state). In the example of defects in diamond, the particular frequency may be about 2.87 GHz, and the degenerate state may be ms=+/−1. In the examples of defects in SiC, the particular frequency may range from about 70 MHz to about 500 MHz, and the degenerate state may be ms=+/−3/2.

When the electrons in the degenerate state are exposed to the light of the first frequency, the electrons recombine back to the ground state of ms=0, and in the process, produce less of the photons of the second frequency. This also leads to a change in photocurrent that may be measured by the current sensor. In some examples, the change in photocurrent may represent a dip or an increase in photocurrent, depending on the type of defect centers 106.

When a magnetic field is present, the Zeeman effect occurs which splits the degenerate state level (e.g., ms=+/−1 or ms=+/−3/2) into two distinct energy levels (e.g., ms=+1 and ms=−1, or ms=+3/2 and ms=−3/2, which can be occupied by the electrons through the microwave stimulation. When excited by light of the first frequency, electrons in the two split states are elevated to a high energy level and recombine back to ground state, thus producing different photoluminescence intensities at the two different microwave frequencies. Thus, two measurable resonance dips in photoluminescence occur. The same resonances may be measured as changes in the photocurrent. For example, the photocurrent may drop by about 1% to about 20% at the resonant frequencies, relative to non-resonance photocurrent. This dip (or "contrast") observed in the photocurrent may depend on the charge relaxation rate (or charge cycle rate) of the defects, which may be dependent on the type of the defect. The difference in frequency between the double minima is determined by the energy gap between these two split levels (also referred to as a Zeeman shift). The gap itself depends on the strength of the magnetic field and, in the case of NV centers, may be about 28 MHz/mT. Therefore, the strength of the magnetic field may be determined by measuring the frequency difference between the double minima in photocurrent. Accordingly, in some embodiments, the atomic defect center 106 acts as a magnetometer of atomic size with sensitivity to magnetic field in the order of pT.

A desirable aspect of the present invention is the photoelectric gain mechanism, which may lead to high detection efficiency since every photon of the light of first frequency has the ability to generate more than one electron-hole pair. The amount of photocurrent may depend on the density of the atomic defects centers 106 in the defect site 104, and may be in the picoamp to nanoamp range, according to some examples.

As shown in FIG. 1B, in some embodiments, the pair of electrodes 108a and 108b is a pair of interdigital electrodes 108a-1 and 108b-1 (e.g., comb-like structures fitting into each other). Such an arrangement allows for great trace length around the defect site 104 for capturing photocurrents generated by the defect site 104 before they recombine in the material. As shown in FIG. 1C, in some embodiments, the pair of electrodes 108a and 108b may be a pair of rectangular or trapezoidal electrodes 108a-2 and 108b-2 that face each other, and which may partially overlap the defect site 104. According to some embodiments, the rectangular or trapezoidal electrodes 108a-2 and 108b-2 allow for small feature sizes and be well-suited for use in high-density arrays. For example, the depth L1 of the atomic defect sensor 100-2 along the first direction D1 and the width L2 of the atomic defect sensor 100-2 along the second direction D2 may each be about 10 μm to about 100 μm. Aside from the electrodes 108a and 108b, the atomic defect sensors 100-1 and 100-2 may be same or substantially the same as the atomic defect sensors 100. As such, a detailed description of atomic defect sensors 100-1 and 100-2 will not be repeated here.

Figure 2A:
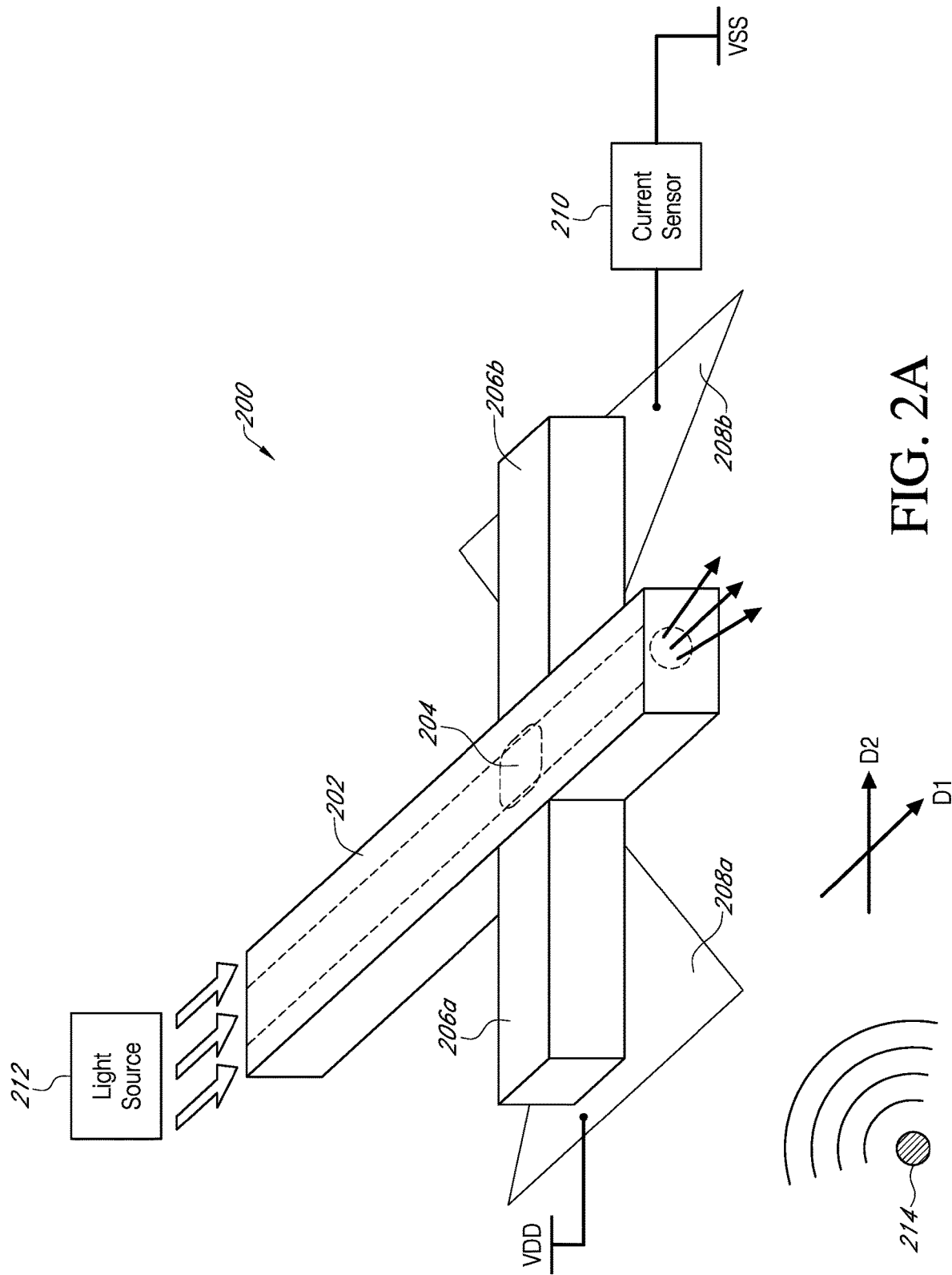
FIG. 2A illustrates an atomic defect sensor, according to some embodiments of the present invention.

FIG. 2A illustrates an atomic defect sensor 200, according to some embodiments of the present invention.

According to some embodiments, the atomic defect sensor 200 includes an optical waveguide 202 extending in a first direction D1, a defect site 204 within the optical waveguide 202, and a first doped fin 206a and a second doped fin 206b integrated with (e.g., forming a unitary/unified body with) the optical waveguide 202 and extending in a second direction D2 crossing (e.g., perpendicular to) the first direction D1. In some embodiments, the first and second fins 206a and 206b are electrically coupled to first and second sides, respectively, of the optical waveguide 202 at a point corresponding to the defect site 204. For example, the defect site 204 and the first and second fins 206a and 206b may be aligned along a same axis. The defect site 204 may be the same or substantially the same as the defect site 104, and thus, a description of the defect site 204 will not be repeated here.

The optical waveguide 202 includes intrinsic material, such as diamond, silicon carbide, or the like. According to some embodiments, the first and second doped fins 206a and 206b include (e.g., are formed of) the same material as the optical waveguide 202, and are doped to enable conduction of electrical current through the atomic defect site 204. In some examples, the first doped fin 206a includes P-type material and the second doped fin 206b includes N-type material, thus forming a P-I-N junction with the optical waveguide 202. However, embodiments of the present invention are not limited thereto, and in some examples, the second doped fin 206b may include P-type material, thus forming a P-I-P junction with the optical waveguide 202. The p-type material may include boron doping (e.g., may be doped with about 1e19/1e20/cm$^2$ of boron), and the n-type material may include dopings of any group V element, such as phosphorous doping. The optical waveguide 202 and the first and second fins 206a and 206b may be co-fabricated (e.g., may be concurrently etched from the same diamond substrate). The P-I-N or P-I-P junctions allow for electrical readout of photo-ionized current from the defect centers in the defect site 204.

The first doped fin 206a may be electrically coupled to the first DC voltage source VDD, and the second doped fin 206b may be electrically coupled to the second DC voltage source VSS, which is at a lower potential than the first DC voltage source VDD. In some embodiments, a first electrode 208a may be coupled between the first DC voltage source VDD and the first doped fin 206a, and a second electrode 208b may be coupled between the second DC voltage source VSS and the second doped fin 206b. The first and second electrodes 208a and 208b may be planar contacts that cover a bottom side (as shown) or a top side of the first and second fins 206a and 206b to increase or maximize contact surface therebetween and, in effect, reduce or minimize contact resistance. However, embodiments of the present invention are not limited thereto, and the first and second electrodes 208a and 208b may be three-dimensional and cover part of all of the front, back, and/or left/right sides of the first and second fins 206a and 206b as well.

The use of the doped first and second fins 206a and 206b as integrated ohmic contacts significantly improves the electrical readout sensitivity, and the thin optical waveguide 202 allows the atomic defect sensor 200 to achieve high charge mobility (e.g., in diamond).

A current sensor 210, which is electrically connected between the first and second DC voltage sources VDD and VSS, senses the current passing through the defect site 204. The current sensor 210 may include an on-chip current amplifier and/or current-to-voltage converter.

The optical waveguide 202 guides the light (e.g., green light) from the light source 212 (e.g., a laser or photodiode) toward the defect site 204, which resides within the optical waveguide 202. The light interacts with, and excites, unpaired electrons of the atomic defect centers (e.g., atomic-scale quantum defects). These stimulated electrons may then be swept away by the potential difference generated across the defect site by the first and second fins 206a and 206b, which are at different potentials.

As described above with respect to FIGS. 1A-1B, the magnetic field present at the location of the defect site 204 may be measured via the Zeeman interaction with magnetic sublevels ms=±1 of energy levels in the ground state spin structure of the charged defect centers (e.g., the negatively charged nitrogen vacancy defects) in the defect site 204. An external magnetic field, which the atomic defect sensor 200 seeks to measure, splits the degeneracy between the ms=±1 states by an amount set by the gyromagnetic ratio γ≈2.8 MHz/G, which is the change in electronic energy due to interactions with an incident magnetic field. According to some embodiments, the atomic defect sensor 200 determines the strength of the external magnetic field by measuring this energy splitting using electron spin resonance (ESR), which utilizes spin-dependent photoionization of carriers (e.g., unpaired electrons) from the defect centers in the defect site 204. The long spin coherence time of the atomic defect sensor 200, which may be as long as 1 ms at room temperature, allows for narrow ESR linewidths and consequently high magnetic field sensitivity.

Unlike optically detected magnetic resonance (ODMR), which exhibit low field sensitivity (measured in units of nT/√Hz) due to low photon collection efficiencies of about 1%, the electrically detected magnetic resonance (EDMR) utilized by the atomic defect sensor 200 provides a sensitivity that is limited by current shot noise instead of photon shot noise. Because of an effectively higher collection efficiency for electrons versus photons, due to the p-i-n doping structure, the atomic defect sensor 200 may provide higher signal-to-noise ratios than systems adopting the ODMR technique. In some examples, the atomic defect sensor 200 may provide a SNR in the range of about 10 pT/√Hz to about 100 pT/√Hz. Because of the photon confinement effect of the optical waveguide 202, the photonic structure of the atomic defect sensor 200 minimizes or substantially reduces the optical excitation of the doped first and second fins 206a and 206b, which could otherwise negatively impact SNR. Further, the integration of the on-chip current sensor 210 with the atomic defect sensor 200 (e.g., direct integration of the current sensor 210 with the diamond substrate from which the atomic defect sensor 200 is etched) also improves SNR relative to systems in which the current sensor or amplifier are not integrated with the atomic defect sensor.

According to some examples, the lower bound for the dynamic range of the atomic defect sensor 200 may be set by the linewidth of the ESR resonances, which depends on the spin coherence time of the defect centers used in the defect site 204. In some examples, the minimum detectable field using a single defect center may be about 30 nT to about 300 nT, for long coherence times in the 100 µs to about 1000 μs range. In other examples using an ensemble of defect centers, the minimum detectable field may be even lower, for example, several hundred pT for coherence times in the 100 μs to about 1000 μs range. The upper bound of the dynamic range may be limited by energy level anti-crossings in the defect center electronic structure, which may become significant above about 50 mT.

In some embodiments, the upper limit to the bandwidth of the atomic defect sensor 200 corresponds to (e.g., is set by) the cycling time of the electrons under optical excitation, which may be dominated by the approximately 200 ns lifetime of the metastable state populated during the relaxation process. Thus, according to some examples, the bandwidth of the atomic defect sensor 200 may be up to a few MHz. In contrast, bandwidth limits of the related art ODMR techniques are dominated by photon counting statistics from the relatively weak optical signal of the defect centers measured in a confocal topology, which may limit such techniques to sub-kHz bandwidths to allow enough time to collect sufficient signal. The atomic defect sensor 200, according to some embodiments, exceeds these bandwidth limitations owing to the much higher SNR achievable over optical techniques to approach MHz bandwidth performance.

Figure 2B:
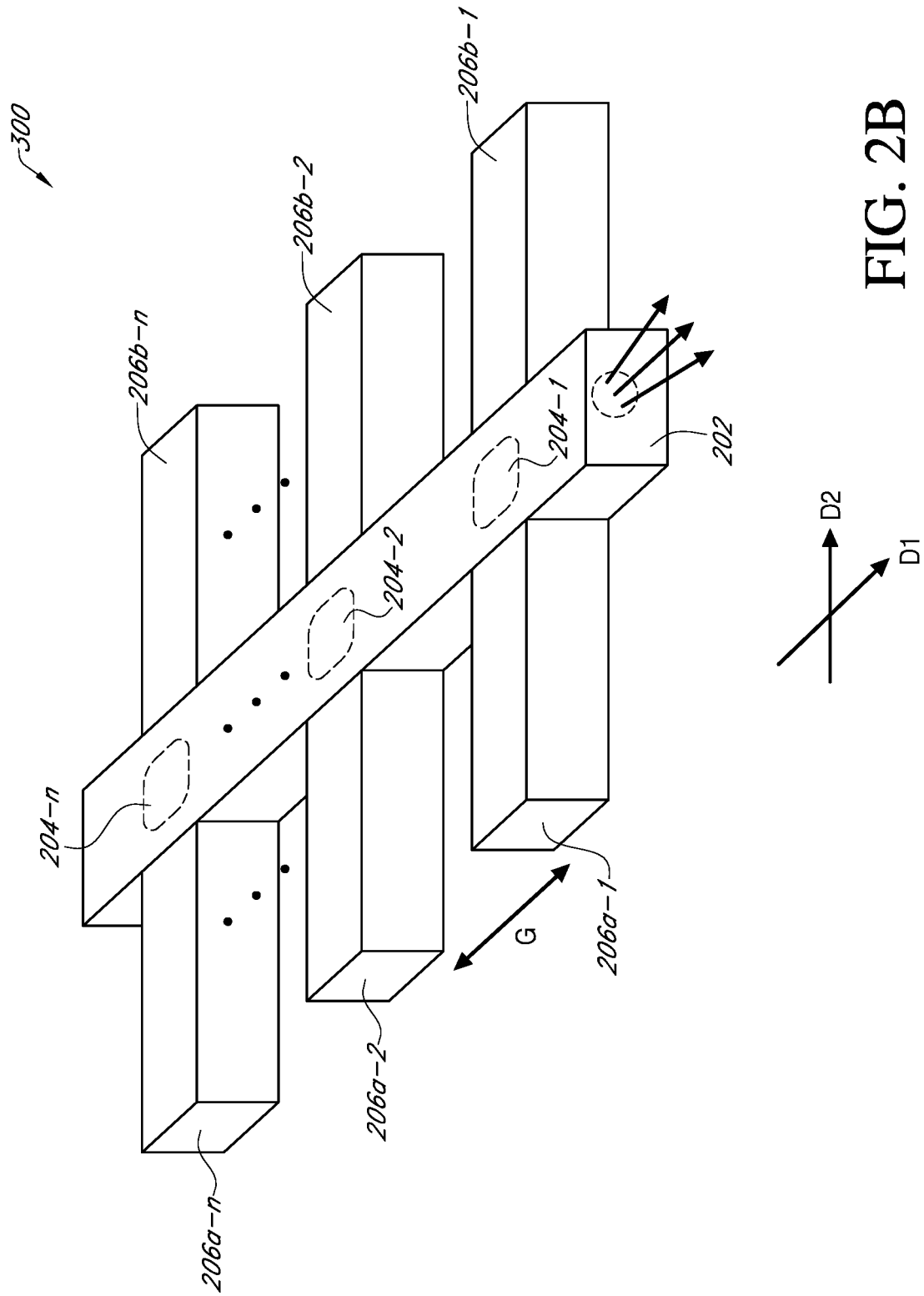
FIG. 2B illustrates a one-dimensional sensor array including atomic defect sensors 200, according to some embodiments of the present invention.

FIG. 2B illustrates a one-dimensional sensor array 300 including atomic defect sensors 200, according to some embodiments of the present invention.

According to some embodiments, a plurality of atomic defect sensors 200 may share a common optical waveguide 202 to form a one-dimensional sensor array 300. In some embodiments, the one-dimensional sensor array 300 is formed by etching the optical waveguide and a plurality of first fins 206a-1 to 206a-n (where n is an integer greater than two) and second fins 206b-1 to 206b-n out of a same substrate (e.g., diamond or SiC), doping the fins to form P-type and/or N-type regions, and patterning a plurality of defect sites 204-1 to 204-n to correspond to the crossing points of the corresponding fins and the optical waveguide 202. In such an array, a single light source may concurrently (e.g., simultaneously) excite all defect sites 204-1 to 204-n along the shared optical waveguide.

The defect sites 204-1 to 204-n may be patterned at regular intervals. For example, the separation between each pair of doped fins 206 may be about 220 nm to about 2 μm. The optical waveguide 202 may itself be hundreds of micrometer long or much longer, depending on the application. However, the power loss in the optical waveguide 202 (which may be about 0.5 db/cm in a diamond waveguide) may limit how long the waveguide can be in practice. The sensing volume of the atomic defect sensors 200, which may be the volume of the defect centers 106, may be as small as 1 nm$^3$, in some examples.

The design of the atomic defect sensor 200 is particularly amenable to arrays. For example, while FIG. 2B illustrates only a one-dimensional sensor array 300, several one-dimensional sensor arrays may be formed side-by-side to produce a two-dimensional sensor array. Similarly, a multitude of atomic defect sensors 100 may be distributed along a plane to form a two-dimensional sensor array. Such two-dimensional sensor array may be capable of imaging the spatial variation of an external magnetic field along a two-dimensional plane. The resolution of such a magnetic image is determined by the spacing between adjacent defect sites. According to some examples, the minimum spacing between pixels may be limited by the requirement for photocurrent generated by each defect site 204-i (i being an integer from 1 to n) to only be collected by the fins 206a-i/206b-i corresponding to the defect site 204-i. This may be a function of the lateral diffusion of electrons in the waveguide 202 (which may be made of diamond) as well as the uniformity of the electric field applied to the waveguide 202 that directs excited charge carriers to their respective drain contacts (e.g., electrode 208a/b).

Referring to FIGS. 2A-2B, a single defect site 204 may only provide a measurement of the magnetic field along its symmetry axis. However, utilizing an ensemble of defect centers 106 with different crystal orientations may provide access to magnetic fields along other axes. A measurement of the Zeeman splitting provides the magnitude of the field along the defect axis, not the sign of the field, and any additional measurements from other crystallographic orientations may also only provide field magnitude information along each crystallographic orientation. However, with a two-dimensional array of atomic defect sensors 100/200, additional vector information can be inferred from stitching the measurements of adjacent sensors together and applying the constraint that the divergence of the magnetic field is zero. In some examples, vector magnetometry can be achieved at each defect site 104/204 due to the ensemble of defects centers 106 at each defect site 104/204, which may be partitioned into at least four distinct classes according to the symmetry axis in the crystal lattice. The four classes of defects centers 106 at each site 104/204 are sensitive to different physical directions, and therefore produce a unique configuration for the four pairs of Zeeman-split lines. By inverting the unique configuration, it may be possible to deduce the vector orientation of the magnetic field incident on the defect site 104/204.

The size of the sensor array may be tuned to obtain a desired resolution/SNR tradeoff for a given application. For example, SNR may be improved, at the expense of reducing spatial resolution, by changing the effective sensor size and wiring multiple sensors 100/200 in parallel.

According to embodiments of the present invention, optical excitation via the waveguide 202 (e.g., the on-chip waveguide) allows for targeted excitation of the intrinsic region while reducing or minimizing exposure of doped regions to optical excitation, which would contribute excess background photocurrent and reduce SNR.

Further, the electrical readout of the atomic defect sensor 100/200 eliminates the needs for photon collection optics (such as object lenses, which are required in ODMR systems) and makes the system robust to temperature drift and shock, as no fine optical alignment is necessary for defect excitation or fluorescence collection. Electrical readout according to the embodiments of the present invention also eliminates the need to mechanically stabilize a photo-detector's position relative to the sensor, and circumvents the technically challenging task of extracting optical photons from a high refractive index material (such as diamond), while also providing a more efficient method for extracting spin information. Additionally, vibrations may not affect the spatial resolution of the array, as that is determined by electrical leads and layout, not by optical focusing and control. Furthermore, unlike the ODMR solutions of the related art, which require table-top components and setup, the integrated sensor/sensor array according to some embodiments of the present invention allows for a portable design that can be battery operated (assuming the battery provides sufficient RF power to perform ESR and sufficient laser power for defect excitation). Embodiments of the present invention that utilize a diamond substrate 102 or waveguide 202 are also able to endure extreme temperature and pressure environments.

Figure 3A:
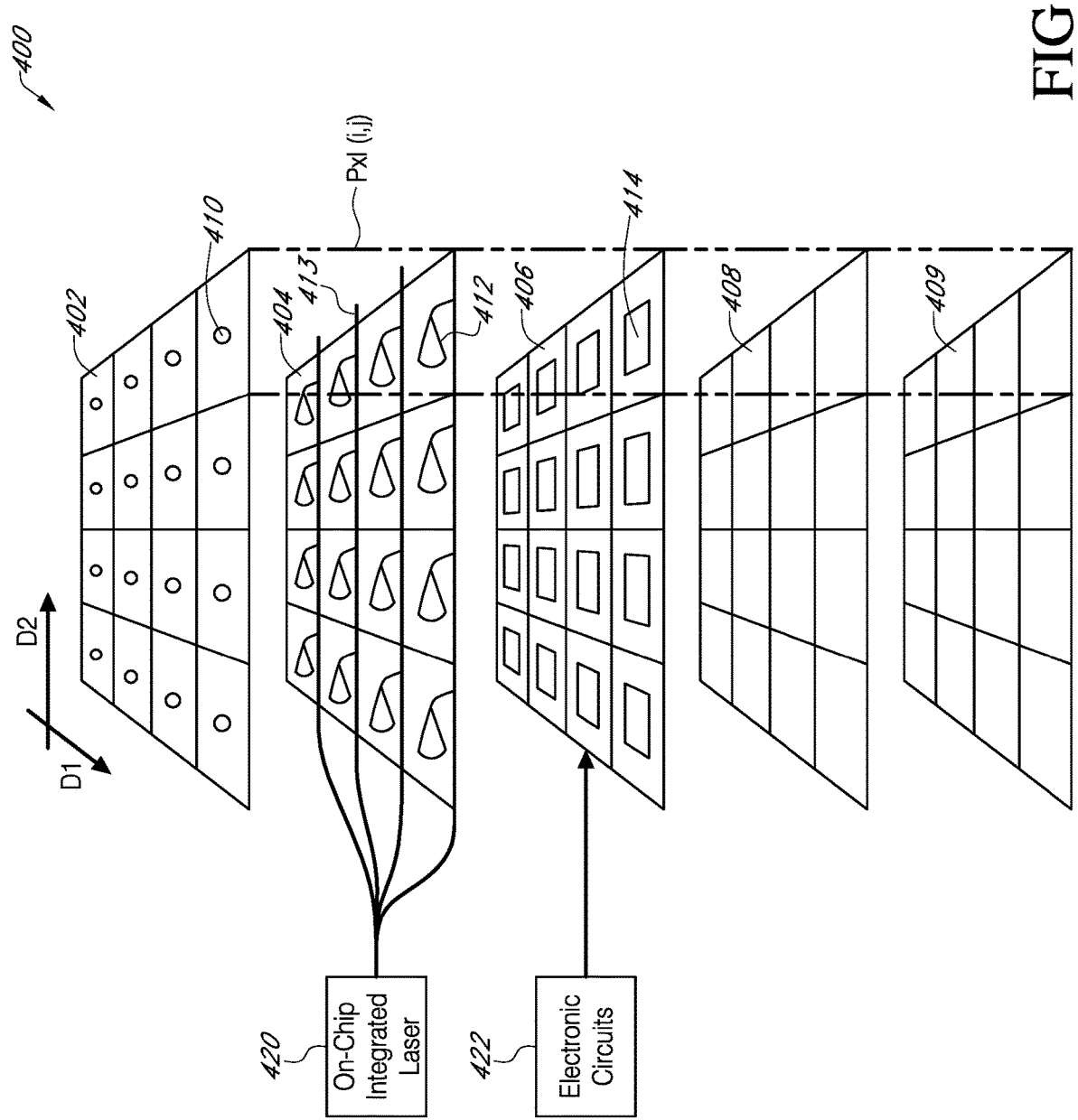
FIG. 3A illustrates an exploded view of a two-dimensional sensor array, according to some exemplary embodiments of the present invention.

FIG. 3A illustrates an exploded view of a two-dimensional sensor array 400, according to some exemplary embodiments of the present invention.

Referring to FIG. 3A, according to some embodiments, the various components of the two-dimensional sensor array 400 may be organized into a number of layers (or stacks) including a quantum defect layer 402 and a photonic layer 404.

According to some embodiments, the quantum defect layer 402 includes a plurality of atomic defect sensors 410, which may be the same as the atomic defect sensors 100-1 (described with respect to FIGS. 1A-1B) and/or atomic defect sensors 100-2 (described with respect to FIGS. 1A and 1C).

In some embodiments, the photonic layer 404 includes a plurality of light sources 412 that correspond to (e.g., have a one-to-one correspondence with) the plurality of atomic defect sensors 410 at the quantum defect layer 402. The light sources 412 may be similar to the light sources 112 and 212 (described with respect to FIGS. 1A-1C and 2A-2B). In some embodiments, the light sources 412 include optical diffraction gratings that receive light from optical waveguides 413 and direct (e.g., focus) the received light onto the corresponding defect sites 104 of the corresponding atomic defect sensors 410 located at the quantum defect layer 402. A row of light sources 412 (e.g., along the second direction D2) may be optically coupled to, and received light from, the same optical waveguides 413.

A desirable effect of utilizing this stacked array structure is that, the defect centers 106 can be formed in one material (e.g., one that is most suitable for the defect centers 106), and the light source 412 can be at a layer having a material with desirable optical characteristics. This allows for intended optimization of the two layers.

According to some embodiments, the two-dimensional sensor array 400 also includes a microelectronics layer 406, which includes a plurality of radio frequency (RF) sources 414 that correspond to (e.g., have a one-to-one correspondence with) the plurality of atomic defect sensors 410 at the quantum defect layer 402. The RF sources may be the same as the RF sources 114 and 214 described with respect to FIGS. 1A-1C and 2A-2B and are each configured to perform microwave tuning the RF signal supplied to a corresponding atomic defect sensor 410.

In some embodiments, the two-dimensional sensor array 400 further includes a readout layer 408 for capturing the data sensed by the atomic defect sensors 410, and an RF source layer 409 for providing RF signals to the pixels Pxl.

While the different layers/stacks of the two-dimensional sensor array 400 (e.g., the quantum defect layer 402, the photonic layer 404, the microelectronics layer 406, the readout layer 408, and the RF source layer 409) are illustrated as separated layers for illustration purposes, the operational two-dimensional sensor array 400 involves compact integration and interlinking of all these layers/stacks.

The photonic layer 404 may be coupled to a laser 420 (e.g., an on-chip, integrated laser) that supplies light of a particular frequency (e.g., green light, in the case of diamond NV centers) to the optical waveguides 413 that are optically coupled to the optical diffraction gratings 412. The light generated by the laser 420 may be continuously applied or may be pulsed for consecutive readout sequences. For example, when a readout sequence is performed, excitation light is applied, followed by the RF signal, and finally by current readout. This sequence may be repeated continuously to extract information from the defect sites 104 in the pixels Pxl. While FIG. 3A illustrates a single laser source, embodiments of the present invention are not limited thereto, and several lasers may be utilized, each of which provides optical light to one or more optical waveguides 413. The microelectronics layer 406 may be coupled to electronic circuits 422 that include microwave electronics for providing a broadband RF signal to the RF sources 414. The electronic circuits 422 may further include a switching network for multiplexed addressing of the atomic defect sensors 410 of the two-dimensional sensor array 400. As illustrated in FIG. 3A, the two-dimensional sensor array 400 may be divided into a plurality of sensing cells/pixels Pxl(i,j) (where i and j are positive integers), each of which represents a vertical stack of elements that is capable of sensing the magnitude of the magnetic field at the location of the sensing cell/pixel Pxl(i,j). For example, each sensing cell/pixel Pxl(i,j) (henceforth simply referred to as pixel Pxl(i,j)) includes an atomic defect sensor 410, an optical diffraction grating 412, RF source 414, as well as other corresponding elements from the layers below the quantum defect layer 402.

Figure 3B:
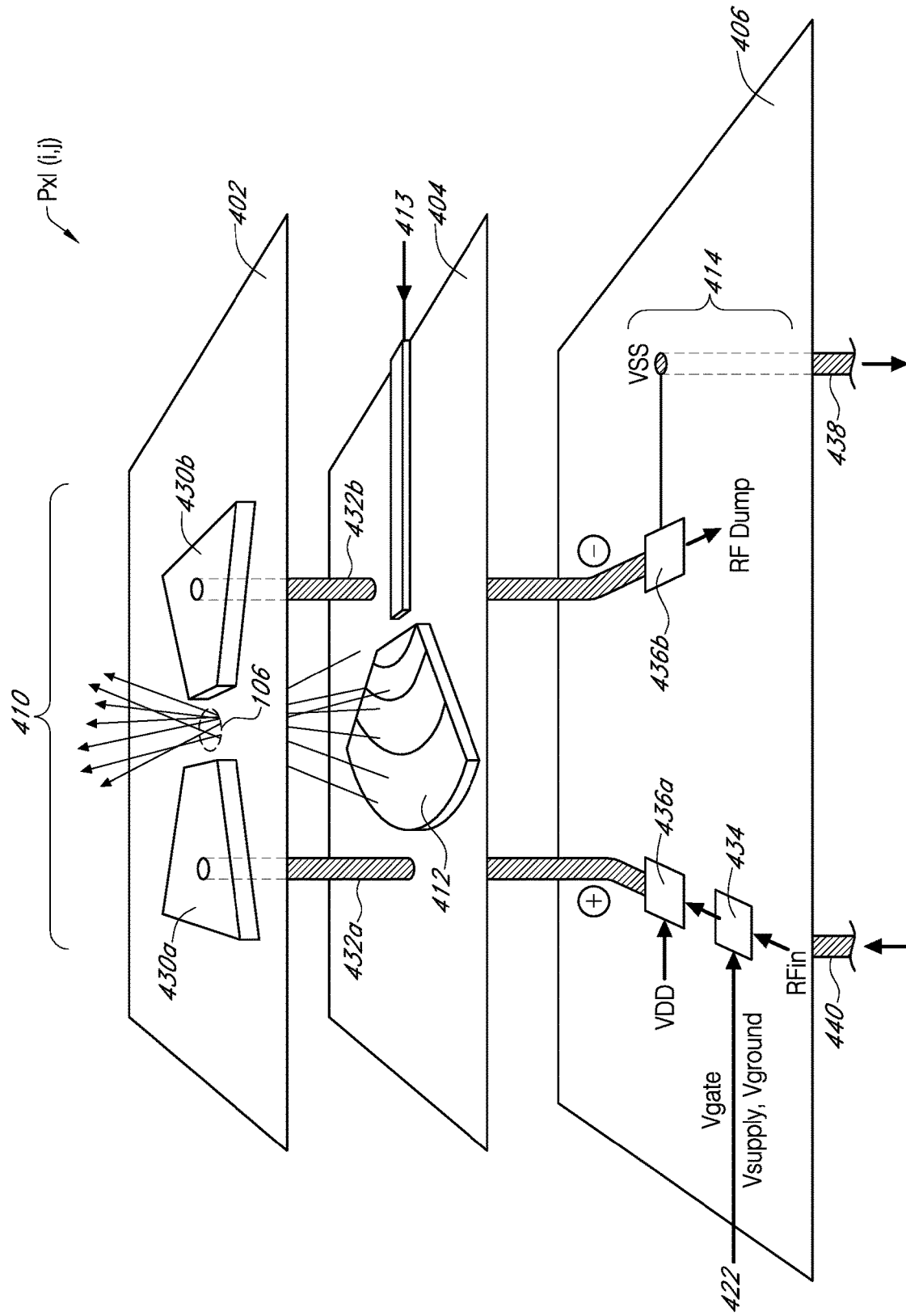
FIG. 3B illustrates an exploded view of several layers of a pixel of the two-dimensional sensor array, according to some exemplary embodiments of the present invention.

FIG. 3B illustrates an exploded view of several layers of a pixel Pxl(i,j) of the two-dimensional sensor array 400, according to some exemplary embodiments of the present invention.

In referring to FIG. 3B, while the atomic defect sensor 410 illustrated in FIG. 3B is the same as the atomic defect sensor 100-2 illustrated in FIG. 1C, embodiments of the present invention are not limited thereto. For example, the atomic defect sensor 410 may be the same as the atomic defect sensor 100-1 illustrated in FIG. 1B, which has the interdigital electrodes.

According to some embodiments, the electrodes 430a and 430b of the atomic defect sensor 410 at the quantum stack 402 may be electrically connected to the RF source 414 at the microelectronics layer 406 by a pair of vias (e.g., vertical vias) 432a and 432b that pass through the photonic layer 404.

In some embodiments, the RF source 414 applies not just the DC biasing voltages (i.e., the first voltage VDD and second voltage VSS) but also the RF signal RFout(i,j) to the atomic defect sensor 410 through the pair of vias 432a and 432b. In such embodiments, the RF source 414 includes a varactor 434, which is configured to generate a tuned Rf signal RFout(i,j) based on a broadband RF signal RFin. The RF source 414 combines the RF signal with the first voltage VDD using a positive bias tee 436a, which includes a resistor-capacitor (RC) circuit that adds the tuned Rf signal RFout(i,j) to the first voltage VDD and applies the resultant combined signal VDD+RFout(i,j) to the first via 432a. Thus, combined signal VDD+RFout(i,j) is applied to the first electrode 430a of the atomic defect sensor 410. The second electrode 430b of the atomic defect sensor 410 is electrically connected to a negative bias tee 436b at the microelectronics layer 406 through the second via 432b. The negative bias tee 436b may be coupled to a termination point that acts as an RF dump. In some examples, the termination point may be a 50 ohm resistor or a comparable impedance matched resistor on chip.

According to some embodiments, the varactor 434 is a variable capacitance diode, that effectively acts as a tunable filter (e.g., a tunable low-pass filter) with an adjustable pass band that can individually tune the frequency of the generated Rf signal RFout(i,j) to closely correspond to the magnitude of the magnetic field being sensed by the particular atomic defect sensor 410 of the same pixel Pxl(i,j). The varactor 434 may do so using an input broadband RF signal RFin that may be common to all of the pixels Pxl. The tuning of the varactor 434 may be achieved by adjusting a gate voltage Vgate of the varactor, which is supplied by the electronic circuits 422. The supply and ground voltages Vsupply and Vground used to operate the varactor 434, as well as the first supply voltage VDD may also be provided by the electronic circuits 422.

While the embodiments illustrated in FIG. 3B provide individual control over sweeping frequencies of the Rf signal RFout(i,j) applied to each of the pixels Pxl(i,j), embodiments of the present invention are not limited thereto. For examples, antenna lines, which are electrically coupled to the electronic circuits 422, may be placed at the quantum defect layer 402 and may emit the same broadband RF signal (e.g., the broadband RF signal RFin) to all of the pixels Pxl. As described below, doing so may be desirable when sensing a fast varying magnetic field. However, when the magnetic field is slow-varying or static, having individual control over sweep frequency may provide higher bandwidth and greater dynamic range relative to a case in which the same broadband RF signal is applied to all of the pixels Pxl.

This is due to the fact that for the atomic defect sensors 410 to sense the strength of the magnetic field, the frequency of the RF signal at the location of the defect site 104 has to be resonant with the spin transitions of the defect centers 106. The RF frequency may be swept across a wide range of frequencies to ensure that the two resonant tones (or one of the two tones) of the defect centers 106 of each atomic defect sensors 410 is swept over, but this will result in a low bandwidth as sweeping over portions of the frequency band not at resonance with the spin transitions doesn't yield any information about the magnetic field and only wastes sweep time. However, if the magnetic field doesn't change very fast (or, e.g., is static), each RF source 414 may track/follow (via the electronic circuits 422) the sensed magnetic field at the corresponding pixel Pxl(i,j) so that the sweep range can be reduced to cover the one or two resonant tones. Because the average of the frequencies f1 and f2 of the two resonant tones is always a constant value (e.g., about 2.8 GHz for diamond), and the frequencies f1 and f2 shift/move symmetrically about the average frequency, only one of the two tones is tracked, according to some embodiments of the present invention. In some examples, tone tracking may be achieved by a lock-in technique whereby a circuit is utilized to achieve a control feedback loop so that any shift the transitions can be followed at a rate proportional to the inverse of the total integration time per sequence.

While the embodiments illustrated in FIG. 3B provide both of the biasing voltages VDD and VSS and the Rf signal RFout(i,j) from the microelectronics layer 406, embodiments of the present invention are not limited thereto. For example, the DC biasing voltages (i.e., the first voltage VDD and second voltage VSS) may be supplied by conductive lines residing at the quantum defect layer 402, which are shared by some of or all of the pixels Pxl. However, providing the combined signals VDD+RFout(i,j) and VSS+RFout(i,j) through the pair of vias 432a and 432b allows for greater integration and potentially smaller pixel sizes (and hence greater sensing resolution), by freeing up crucial space at the quantum defect layer 402 that would have otherwise been taken by conductive lines.

Referring again to FIG. 3B, when the light from the optical diffraction grating 412 excites the defect centers at the atomic defect sensor 410 while the combined signal RFij+VDD is applied to the first electrode 430a, unpaired carriers at the defect site 106 are collected by the second electrode 430b, which is at the second DC voltage VSS (e.g., ground). The resulting photocurrent passes through the second via 432b to the negative bias tee 436b, which is coupled to a termination point. The photocurrent is then directed by a readout via 438 to the readout layer 408 for collection and measurement.

Figure 3C:
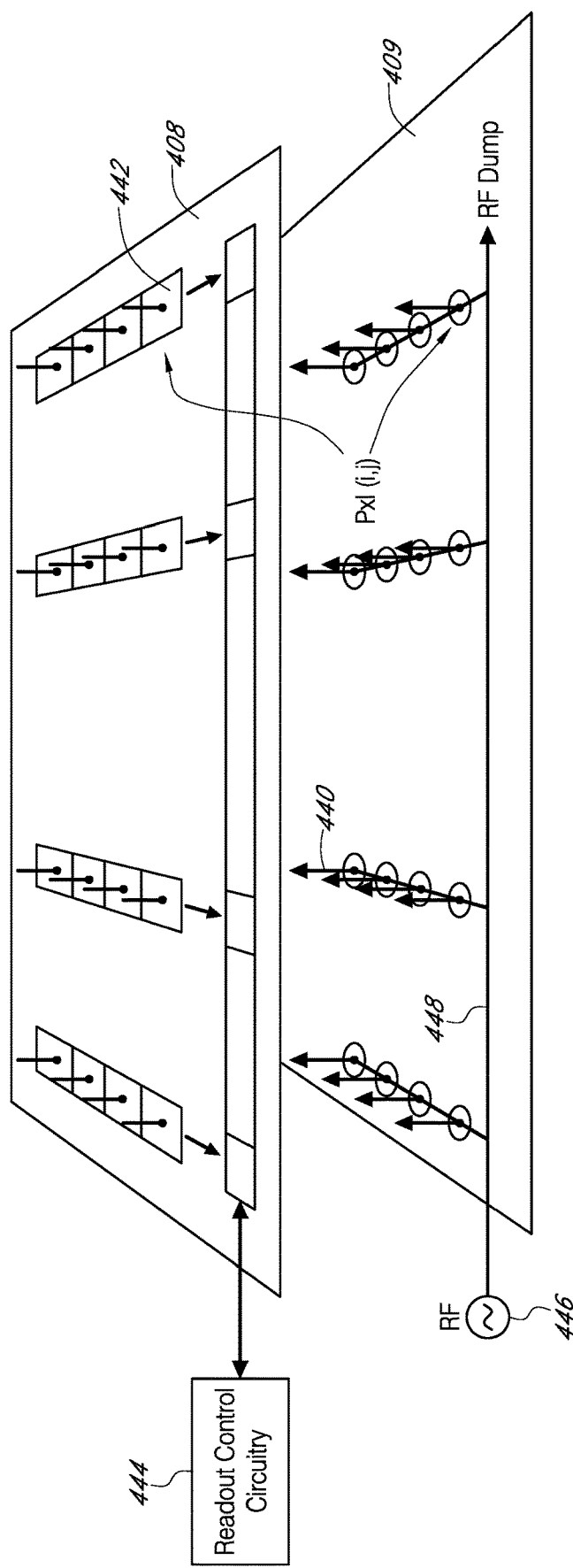
FIG. 3C illustrates a readout layer and an RF source layer of the two-dimensional sensor array, according to some embodiments of the present invention.

FIG. 3C illustrates the readout layer 408 and the RF source layer 409 of the two-dimensional sensor array 400, according to some embodiments of the present invention.

Referring to FIG. 3C, in some embodiments, the readout layer 408 includes a plurality of interconnected charge accumulation capacitors 442, each of which corresponds to an atomic defect sensor 410, and thus a pixel Pxl. Each charge accumulation capacitor 442 is electrically coupled to a corresponding RF source 414 of the same pixel Pxl through the readout via 438, and is able to receive and store the charge from the photocurrent of the corresponding atomic defect sensor 410. The stored charge is indicative of the strength of the magnetic field at the location of the atomic defect sensor 410.

In some examples, the charge accumulation capacitors 442 of the plurality of pixels/cells together make up a frame transfer CCD image array that can be readout by a readout control circuit 444 in a time-multiplexed manner by shifting/moving the stored charges between neighboring charge accumulation capacitors 442 one at a time. In some examples, readout control circuit 444 may control the last charge accumulation capacitor 442 to supply its charge into a charge amplifier, which then converts the charge into a voltage. By repeating this process, the readout control circuit 444 converts the entire contents of the array of charge accumulation capacitors 442 to a sequence of voltages. These voltages are then sampled, digitized, and stored in memory for further processing to determine the strength of the magnetic field at each pixel Pxl.

Referring still to FIG. 3C, in some embodiments, the RF source layer 409 includes a broadband RF signal generator 446 that is electrically coupled to the varactor 434 of each pixel Pxl via a plurality of RF vias 440 and a plurality of transmission vias 448.

Figure 4A:
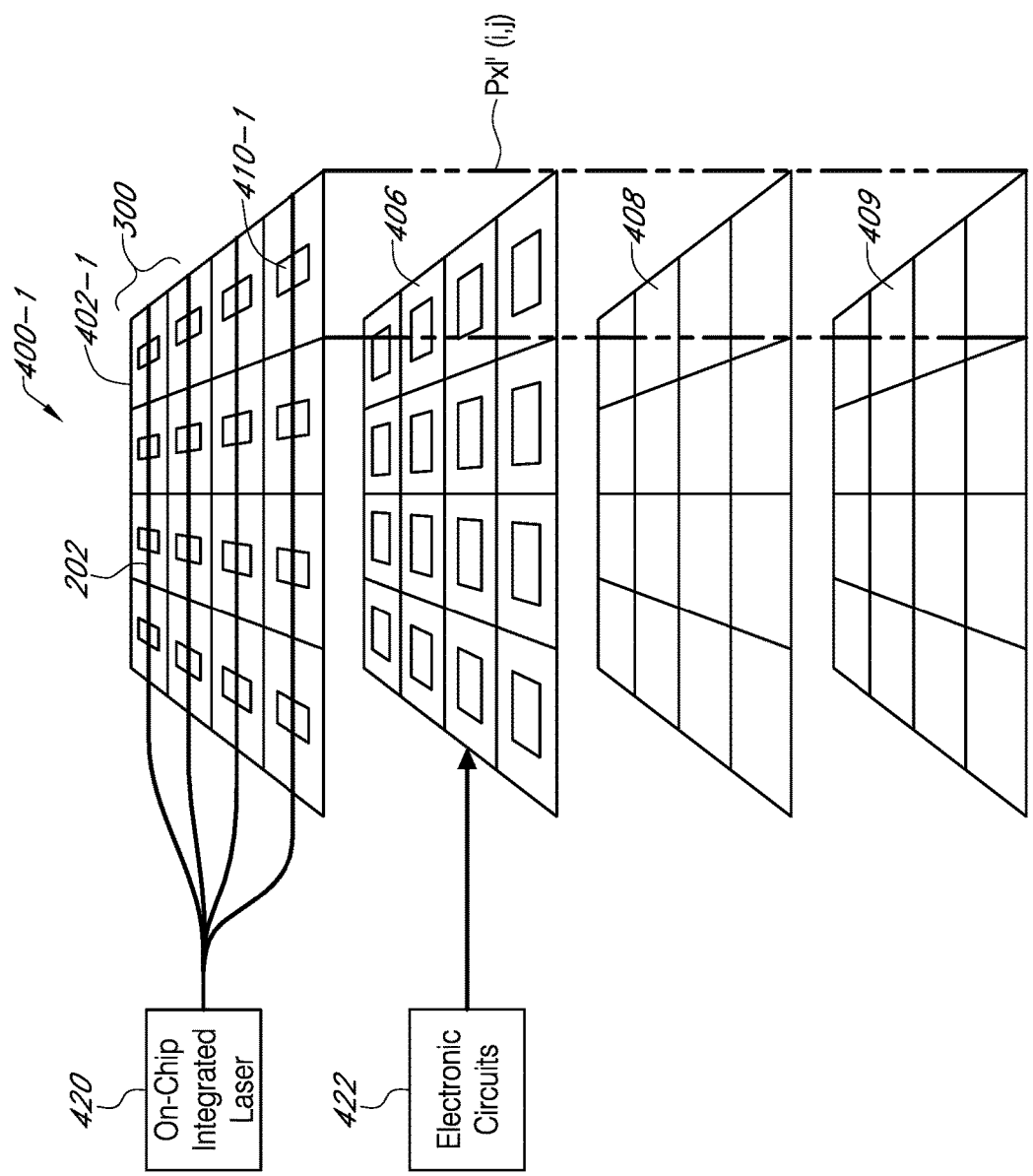
FIG. 4A illustrates an exploded view of a two-dimensional sensor array 400-1, according to some exemplary embodiments of the present invention.
Figure 4B:
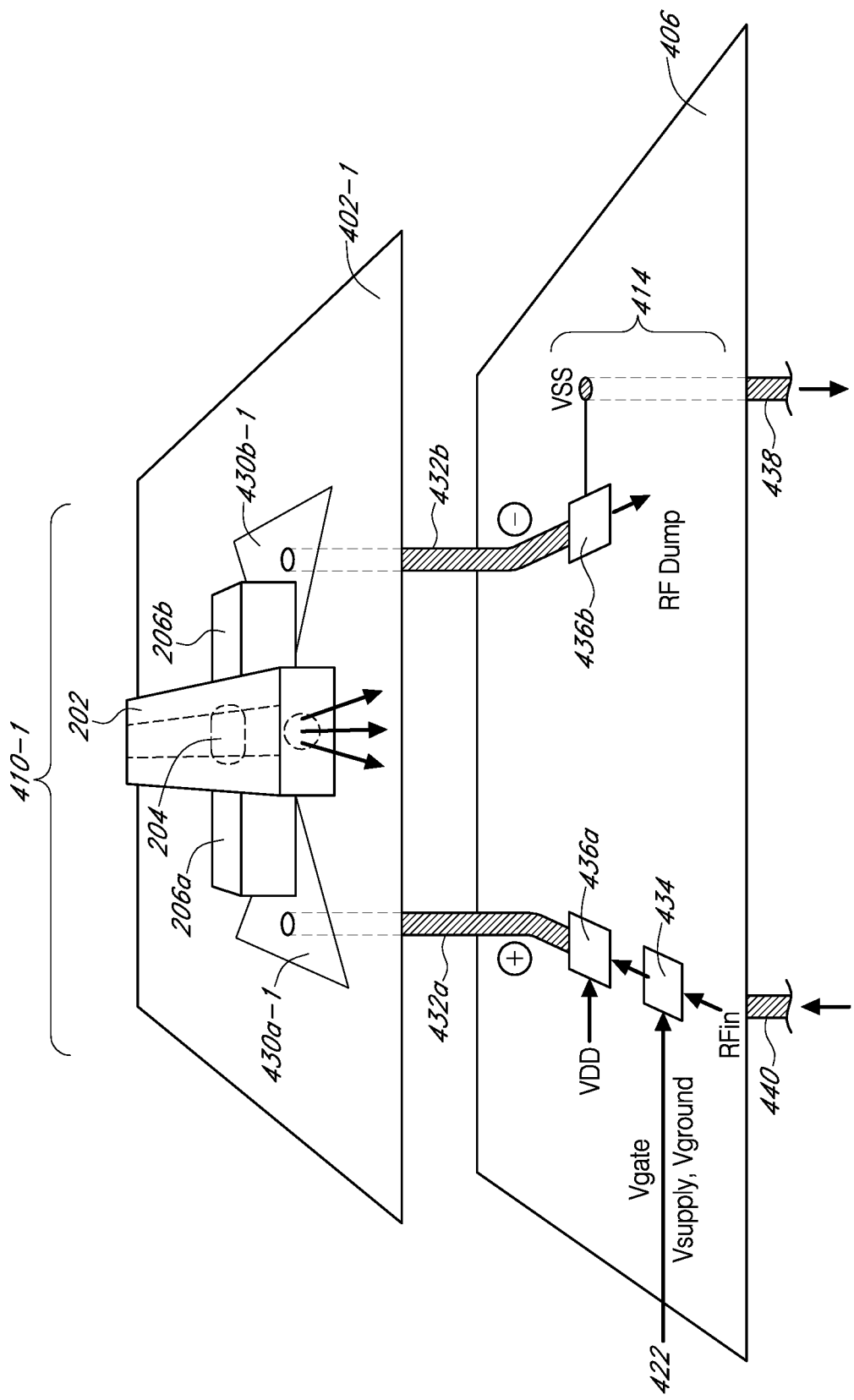
FIG. 4B illustrates an exploded view of several layers of a pixel of the two-dimensional sensor array, according to some exemplary embodiments of the present invention.

FIG. 4A illustrates an exploded view of a two-dimensional sensor array 400-1, according to some exemplary embodiments of the present invention. FIG. 4B illustrates an exploded view of several layers of a pixel Pxl'(i,j) of the two-dimensional sensor array 400-1, according to some exemplary embodiments of the present invention.

Referring to FIGS. 4A-4B, according to some embodiments, the sensor array 400-1 is substantially the same (e.g., structurally and functionally) as the sensor array 400 (described with respect to FIGS. 3A-3C), with the exception that the sensor array 400-1 does not utilize a separate photonic layer 404 and that the quantum defect layer 402-1 is different from the quantum defect layer 402 (described above with respect to FIGS. 3A-3B). The operation and structure of the microelectronics layer 406, the readout layer 408, and the RF source layer 409 of the sensor array 400-1 are the same or substantially the same as those of the sensor array 400. As such, a description of common or shared elements will not be repeated here.

The sensor array 400-1 does not require a separate photonic layer 404 as optical routing is integrated into the quantum defect layer 402-1. According to some embodiments, the quantum defect layer 402-1 includes a two-dimensional array of atomic defect sensors 410-1, which are the same as the atomic defect sensors 200 (described with respect to FIG. 2A). The atomic defect sensors 410-1 are arranged to form a plurality of parallel one-dimensional sensor arrays 300 (described with reference to FIG. 2B). As described with reference to FIG. 2B, each one-dimensional sensor array 300 includes a series of atomic defect sensors 410-1/200 sharing a common optical waveguide 202. In some embodiments, a single laser (e.g., an in-chip integrated laser) 420 is utilized to couple optical power into the parallel optical waveguides 202. However, embodiments of the present invention are not limited thereto, and several lasers may be utilized, each of which provides optical light to one or more optical waveguides 202.

Referring to FIG. 4B, each atomic defect sensor 410-1 corresponds to a sensing pixel PXI'. In some embodiments, the first and second doped fins 206a and 206b of the atomic defect sensor 410-1 are electrically coupled to the first and second electrodes 430a and 430b, respectively, which are in turn electrically connected to the microelectronics layer 406 through the pair of vias 432a and 432b. As described above with respect to FIGS. 1A-1C and 2A, the atomic defect sensor 410-1 is configured to sense a magnitude of a physical parameter/quantity (e.g., magnetic field strength, temperature, etc.) by generating a photocurrent corresponding to a magnitude of a physical parameter/quantity and a voltage differential between the first and doped fins 206a and 206b, when excited by light of the a particular frequency (e.g., green light) and affected by the RF signal.

A desirable effect of utilizing the atomic defect sensors 410-1 is that by placing the defect centers 106 within the optical waveguide 202 and integrating the doped fins 206a and 206b with the waveguide 202, the atomic defect sensors 410-1 allow for high level of integration and simplify the structure of the sensed array 400-1.

Further, the design of the sensor array 400/400-1 permit high sensing resolution and sensitivity. Each atomic defect sensors 410/410-1 may potentially offer nanometer or micrometer resolution as the size of the atomic defect site 104 of each sensor may be about 0.5 μm to about 10 μm, in some examples. However, the resolution of the sensor array 400/400-1 (i.e., the pixel size) may be defined by the spacing between adjacent atomic defect sensors 410/410-1 (of adjacent pixels), which may be about 1 μm to about 100 μm, in some examples. Such high pixel density can yield array resolutions that are in the micrometer range.

The sensitivity and resolution may increase the closer the atomic defect sensors 410/410-1 of the array 400/400-1 get to the test object/device (e.g., a conductor passing current within a test circuit). For example, if the array 400/400-1 is far from the test object/device, the magnetic field readings can get blurry/fuzzy. According to some embodiments, the atomic defect centers 106 within atomic defect sensors 410/410-1 are formed at the surface or at a shallow depth below the surface of the substrate 102. For example, NV centers may be formed within a 15 nm depth from the surface of a diamond surface. Because the atomic defect sensors 410/410-1 are at the top-most layer of the array 400/400-1, the shallow depth of the atomic defect centers 106 allows for the atomic defect sensors 410/410-1 to get within nanometers of the test object/device, which substantially improves the sensitivity and resolution of the array 400/400-1.

Thus, by utilizing the array 400/400-1, wide-field imaging magnetometers can be implemented which have high resolution and sensitivity.

According to embodiments of the present invention, the sensor array 400/400-1 and its constituent atomic defect sensors 410/410-1 can measure the intensity of the magnetic field without the need for calibration. This is due to the fact that the magnetic field strength is deduced at the sensed locations (e.g., at the pixels Pxl) via frequency detection, and multiplying the frequency by physical constants that are all fixed. This greatly simplifies the operation of a magnetic field detector utilizing the sensor array 400/400-1.

While in FIGS. 3A, 3C, and 4A, the readout layer 408 has been illustrated as being above the RF source layer 409, embodiments of the present invention are not limited thereto. For example, the vertical position of the readout layer 408 and the RF source layer 409 may be switched.

Referring to FIGS. 3A and 4A, according to some embodiments, the effective pixel size of the array 400/400-1 may be reconfigured on the fly by averaging together the signals measured from a subset of adjacent pixels Pxl/Pxl'.

Figure 5:
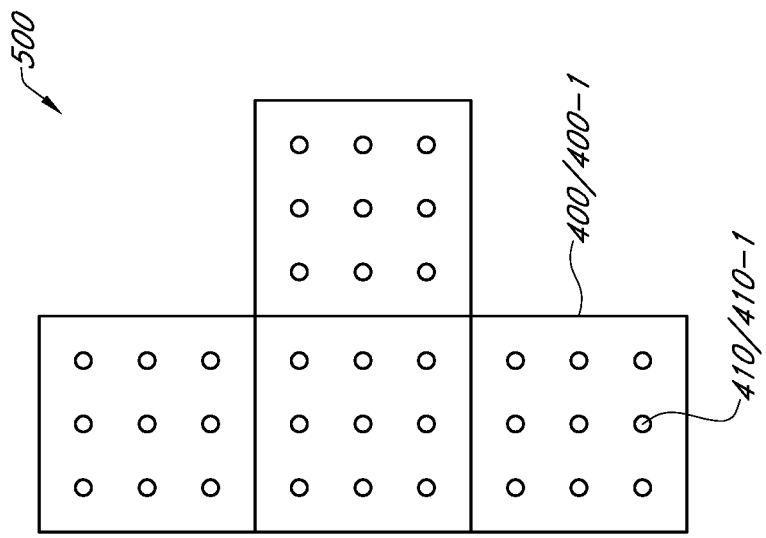
FIG. 5 illustrates a tile arrangement of two-dimensional sensor arrays, according to some embodiments of the present invention.
Figure 5:
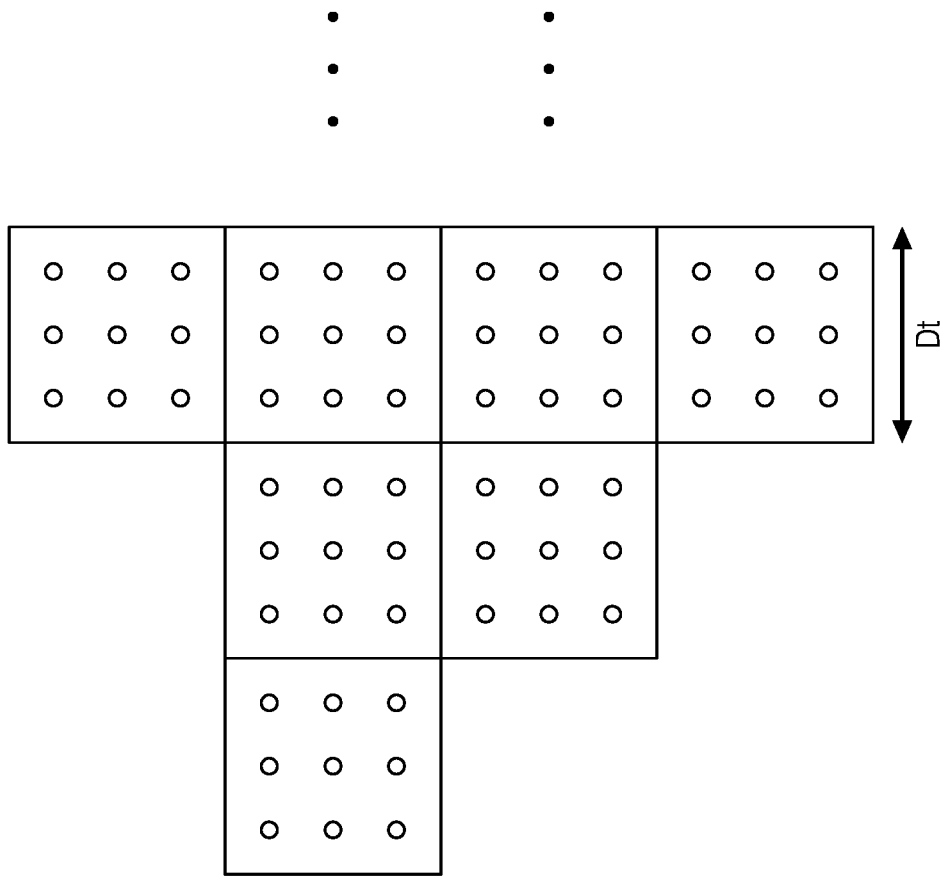

FIG. 5 illustrates a tile arrangement 500 of arrays 400/400-1 according to some embodiments of the present invention.

Referring to FIG. 5, each sensor array 400/400-1 may, in practice, be limited in size by the size of a semiconductor wafer, which may be about 400 mm to about 800 mm in diameter. However, larger sensors of arbitrary size and shape may be formed by arranging together any number of sensor arrays 400/400-1, which may also be referred to as tiles when placed in an arrangement 500.

While some of the embodiments of the present invention have been described as sensing the magnitude of a magnetic field, embodiments of the present invention are not limited thereto. For example, the atomic defect sensors, according to some embodiments, can be used to sense temperature, stress/strain, and/or electric field. For example, temperature affects the average frequency of the resonant tones f1 and f2 discussed with respect to FIG. 3B. Thus, by tracking the change in the average of two tones (i.e., the center frequency), one may sense changes in temperature. Further, strain and electric fields may cause the two tones to move asymmetrically with respect to the center frequency. Thus, by measuring this asymmetry, the atomic defect sensor or sensor array can measure strain and/or electric fields.

Accordingly, embodiments of the present invention leverage the sensitivity of atomic defects in solids, such as the nitrogen-vacancy center in diamond, in a pixelated array enabling a compact and robust solution for addressing and manipulating high densities of defect-based sensors, which are effective at sensing electromagnetic fields, mechanical forces, and high-energy particles with spatial resolution down to nanometers. The use of atomic defect centers, according to embodiments of the present invention, allows high magnetic field sensitivity and calibration-free performance to be realized in a compact and robust solid-state architecture.

It will be understood that, although the terms "first," "second," "third," etc., may be used herein to describe various elements, components, regions, layers, and/or sections, these elements, components, regions, layers, and/or sections should not be limited by these terms. These terms are used to distinguish one element, component, region, layer, or section from another element, component, region, layer, or section. Thus, a first element, component, region, layer, or section discussed below could be termed a second element, component, region, layer, or section, without departing from the spirit and scope of the inventive concept.

The terminology used herein is for the purpose of describing particular embodiments and is not intended to be limiting of the inventive concept. As used herein, the singular forms "a" and "an" are intended to include the plural forms as well, unless the context clearly indicates otherwise. It will be further understood that the terms "include," "including," "comprises," and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list. Further, the use of "may" when describing embodiments of the inventive concept refers to "one or more embodiments of the present invention."

It will be understood that when an element is referred to as being "connected to" or "coupled to" another element, it can be directly connected to or coupled to the other element, or one or more intervening elements may be present. When an element is referred to as being "directly connected to," or "directly coupled to," another element, there are no intervening elements present.

As used herein, the terms "substantially," "about," and similar terms are used as terms of approximation and not as terms of degree, and are intended to account for the inherent variations in measured or calculated values that would be recognized by those of ordinary skill in the art.

As used herein, the terms "use," "using," and "used" may be considered synonymous with the terms "utilize," "utilizing," and "utilized," respectively.

Also, any numerical range recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein. All such ranges are intended to be inherently described in this specification.

The electronic circuits and/or any other relevant devices or components according to embodiments of the present invention described herein may be implemented utilizing any suitable hardware, firmware (e.g. an application-specific integrated circuit), software, or a suitable combination of software, firmware, and hardware. For example, the various components of the electronic circuit may be formed on one integrated circuit (IC) chip or on separate IC chips. Further, the various components of the electronic circuit may be implemented on a flexible printed circuit film, a tape carrier package (TCP), a printed circuit board (PCB), or formed on a same substrate. Further, the various components of the electronic circuit may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the scope of the exemplary embodiments of the present invention.

While this invention has been described in detail with particular references to illustrative embodiments thereof, the embodiments described herein are not intended to be exhaustive or to limit the scope of the invention to the exact forms disclosed. Persons skilled in the art and technology to which this invention pertains will appreciate that alterations and changes in the described structures and methods of assembly and operation can be practiced without meaningfully departing from the principles, spirit, and scope of this invention, as set forth in the following claims and equivalents thereof.

What is claimed is:

1. An atomic defect sensor for measuring a magnitude of a physical parameter, the atomic defect sensor comprising:
    an optical waveguide comprising an atomic defect site located within the optical waveguide, the optical waveguide being configured to guide an optical signal toward the atomic defect site,
    a first doped fin integrated with the optical waveguide at a first side of the optical waveguide; and
    a second doped fin integrated with the optical waveguide at a second side of the optical waveguide,
    wherein the atomic defect site is configured to be energetically stimulated by the optical signal in the presence of an RF signal, and to generate a photocurrent corresponding to the magnitude of the physical parameter and a voltage differential between the first and second doped fins.

2. The atomic defect sensor of claim 1, wherein a change in the photocurrent from a first level to a second level, at a first frequency and a second frequency of the RF signal, indicates resonance, and the magnitude of the physical parameter corresponds to a frequency separation between first and second frequencies of the RF signal.

3. The atomic defect sensor of claim 2, wherein a difference between the first and second levels is about 1% to about 20% of the first level.

4. The atomic defect sensor of claim 1, wherein the first and second doped fins are configured to receive a first voltage and a second voltage, respectively, and
    wherein the voltage differential between the first and second doped fins is a difference between the first and second voltages.

5. The atomic defect sensor of claim 1, wherein the voltage differential is about 1 volt to about 10 volts, and
    wherein the photocurrent is about 1 pA to about 10 nA.

6. The atomic defect sensor of claim 1, wherein one of the first and second doped fins is configured to capture the generated photocurrent.

7. The atomic defect sensor of claim 1, wherein the physical parameter is a strength of a magnetic field at a location of the atomic defect site.

8. The atomic defect sensor of claim 1, further comprising:
    a first electrode contacting the first doped fin at a bottom side of the atomic defect sensor; and
    a second electrode contacting the second doped fin at the bottom side of the atomic defect sensor,
    wherein the atomic defect site is closer to a top side of the atomic defect sensor than the bottom side.

9. The atomic defect sensor of claim 1, wherein the first and second doped fins are at positions along the first and second sides, respectively, that correspond to a location of the atomic defect site.

10. The atomic defect sensor of claim 1, wherein the atomic defect site and the first and second doped fins are aligned along a same axis.

11. The atomic defect sensor of claim 1, wherein the optical waveguide comprises diamond or silicon-carbide (SiC).

12. The atomic defect sensor of claim 1, wherein the atomic defect site comprises one or more nitrogen vacancy (NV) centers.

13. The atomic defect sensor of claim 1, wherein the first and second doped fins comprise a same intrinsic material as the optical waveguide.

14. The atomic defect sensor of claim 13, wherein the first doped fin further comprises p-type doping and the second doped fin further comprises n-type doping.

15. The atomic defect sensor of claim 14, wherein the p-type doping comprises boron and the n-type doping comprises phosphorous.

16. The atomic defect sensor of claim 13, wherein both of the first and second doped fins further comprise p-type dopings.

17. The atomic defect sensor of claim 1, wherein the optical signal has a wavelength of about 532 nm.

18. The atomic defect sensor of claim 1, further comprising:
a plurality of atomic defect sites comprising the atomic defect site, the plurality of atomic defect sites being periodically distributed throughout a length of the optical waveguide.

19. The atomic defect sensor of claim 18, further comprising:
a plurality of first doped fins comprising the first doped fin and integrated with the optical waveguide at the first side of the optical waveguide; and
a plurality of second doped fins comprising the second doped fin and integrated with the optical waveguide at the second side of the optical waveguide
wherein the plurality of first and second fins are positioned to correspond to locations of corresponding plurality of atomic defect sites.

20. The atomic defect sensor of claim 19, wherein a distance between adjacent ones of the plurality of atomic defect sites is about 1 μm.

* * * * *